United States Patent [19]

Poliniak et al.

[11] 4,007,295
[45] Feb. 8, 1977

[54] OLEFIN-SO₂ COPOLYMER FILM ADHESION TO A SUBSTRATE

[75] Inventors: Eugene Samuel Poliniak, Willingboro; Richard Joseph Himics, Skillman, both of N.J.; Henry Wielicki, Wyndmoor, Pa.

[73] Assignee: RCA Corporation, New York, N.Y.

[22] Filed: July 28, 1975

[21] Appl. No.: 599,589

[52] U.S. Cl. .................................. 427/43; 427/250; 427/405; 427/79; 204/38 E; 204/38 B; 358/4; 358/301; 346/1
[51] Int. Cl.² .......................................... H04N 5/82
[58] Field of Search ............ 427/43, 125, 405, 409, 427/250, 79; 264/106; 346/1; 29/199; 204/38 E, 38 B, 46 G; 178/6.6 A; 358/4

[56] References Cited

UNITED STATES PATENTS

| | | | |
|---|---|---|---|
| 3,795,534 | 3/1974 | Mehalso et al. | 264/106 X |
| 3,882,214 | 5/1975 | Nosker et al. | 264/106 |
| 3,893,127 | 7/1975 | Kaplan et al. | 346/1 |
| 3,935,331 | 1/1976 | Poliniak et al. | 427/43 |
| 3,935,332 | 1/1976 | Poliniak et al. | 427/43 |

*Primary Examiner*—Ralph S. Kendall
*Attorney, Agent, or Firm*—Glenn H. Bruestle; Birgit E. Morris; Joseph T. Harcarik

[57] ABSTRACT

To improve the adherence of an olefin-SO₂ copolymer film employed as an electron beam resist to a metallic substrate, a thin film of gold is first applied to the substrate. The resulting bond is strong enough to withstand exposure to electron beams, development of the resist film and electroplating of the film witout undercutting, lifting or distortion of the film.

7 Claims, No Drawings

OLEFIN-SO₂ COPOLYMER FILM ADHESION TO A SUBSTRATE

This invention relates to a method of improving the adhesion of electron beam resists to a substrate. More particularly, this invention relates to a method of improving the adhesion of olefin-SO$_2$ copolymer resist films to metallic substrates.

BACKGROUND OF THE INVENTION

A unique video disc system has been described by Clemens in U.S. Pat. No. 3,842,194. According to this system, disc replicas are fabricated having geometric variations in the bottom of a spiral groove in the disc surface which correspond to capacitance variations representative of video signals.

The disc masters are made by coating a flat aluminum disc with a lacquer or a bright copper layer. A continuous spiral groove about one micron deep having a pitch of about 2000 to 8000 grooves per inch (about 787 to 3150 grooves per cm) is then cut into the surface of the disc, preferably according to the method described by Nosker and Fox in U.S. Pat. No. 3,882,214. The disc master is then coated with an electron beam resist, the information desired recorded by means of a video-signal-modulated electron beam produced by a scanning electron microscope, and the resist developed to translate the information into a surface relief pattern in the bottom of the groove. This developed master is then replicated to form a stamping master from which a plurality of replicas can be made using conventional audio record techniques. The stamping master is made by first depositing a thin gold film on the developed resist layer and then electroplating a thicker layer of nickel. This electroformed replica, or stamping master, is separated at the resist/gold interface by peeling the stamping master from the resist surface.

When electron beam resists of olefin-SO$_2$ copolymers, described in copending application of Kaplan and Davidson, Ser. No. 401,213 filed Sept. 27, 1973 are employed, the developed films are sensitive to the nickel electroplating step. The result is a lack of adhesion and a lifting of the resist during the electroplating, thereby distorting, or even destroying, the developed information pattern.

SUMMARY OF THE INVENTION

We have found that by coating a thin film of gold over the copper clad grooved master prior to coating with an olefin-SO$_2$ copolymer electron beam resist film, the resist film adheres strongly throughout the nickel electroplating step, preventing distortion of the information pattern in the developed resist film.

DETAILED DESCRIPTION OF THE INVENTION

An aluminum disc about 14 inches (35.6 cm) in diameter is machined flat and a layer of bright copper about 0.005 inch (0.013 cm) thick is deposited thereon, and machined flat to within 0.002 inch (0.0005 cm) using a diamond cutter tool. A spiral groove about 0.0001 inch (0.00025 cm) deep and having a pitch about 2000 to 8000 grooves per inch (787 to 3150 groove per cm) is then cut into the copper layer using a shaped diamond cutter.

A thin layer of gold about 1000 to 2000 angstroms thick is then applied to the grooved master. The gold layer can be applied by evaporating in a vacuum chamber, by electroplating or electroless plating. Preferably a thin layer, about 200 to 500 angstroms thick of chromium is applied first to improve the adhesion of the gold layer to the copper clad disc. Evaporation gives a smooth surface and is the preferred method of application.

An olefin-SO$_2$ copolymer electron beam resist is then applied to the disc. The copolymer is dissolved in a suitable solvent and microfiltered to remove any insoluble or gelled copolymer particles larger than about 0.2 micrometers. The filtered solution is then applied to the gold coated master by spinning or solution casting. The thickness of the resultant film is generally about 0.65 micron thick but can be adjusted by varying the concentration of the resist in the solvent or by varying the spinning speed. The wet film is then evaporated in a high vacuum of at least about $10^{-6}$ torr to remove the solvent. This process is disclosed in greater detail in copending application of Poliniak et al, Ser. No. 539,851 filed Jan. 9, 1975.

The olefin-SO$_2$ copolymer is then exposed to a modulated electron beam and the film developed by immersing in or spraying with a suitable solvent developer.

The developed disc is then coated with a thin metal layer. A gold layer is applied by evaporating to a thickness of about 1000 to 5000 angstroms. Alternatively, the developed disc can be immersed in a nickel electroless plating bath until a layer of nickel about 2 to 3 mils thick (0.005 to 0.007 cm) has formed. The disc is then electroplated with a nickel layer to form a backing layer about 0.004 to 0.012 inch thick (0.013 to 0.030 cm). The resultant stamping master can be employed to make a plurality of thermoplastic replicas.

The invention will be further illustrated by the following example but the invention is not to be limited to the details described therein.

EXAMPLE

A copper clad aluminum disc 14 inches (35.6 cm) in diameter was cut with a diamond stylus to describe a trapezoidal, smooth, spiral groove about 1 micrometer deep and having a pitch of about 5555 grooves per inch (2187 grooves per cm) in accordance with the method described in U.S. Pat. No. 3,882,214, referred to hereinabove. A layer of chromium about 300 angstroms thick and then a layer of gold about 1500 angstroms thick was evaporated onto the disc in a vacuum chamber in conventional manner.

A solution containing 7% by weight of a copolymer having a molecular weight of about 175,000 derived from 1-methyl-cyclopentene and SO$_2$ in cyclopentanone was filtered successively through 5.0, 1.0, 0.5, and 0.2 micrometer filters.

The copolymer solution was applied to the disc spun at 140 rpm. The resultant film was about 0.6 micrometer thick. The coated master was dried for about 18 hours in a vacuum chamber evacuated to a pressure of $10^{-6}$ torr.

The film was exposed to the beam of a scanning electron microscope at an accelerating potential of 10 kV and a beam current of 3 nA. An approximately Gaussion-shaped beam having a full width at ½ amplitude of about 0.5 micrometer was scanned to describe rasters in the surface of the film. The resist surface was then rinsed with Freon TF, a trademark for trichlorotrifluoroethane of the du Pont de Nemours Company and then developed by immersing in 2-methylcyclohexanone for 2 minutes. Excellent raster patterns were developed.

A layer of gold about 1000 angstroms thick was evaporated onto the developed resist layer. The stamping master was completed by electroplating a layer of nickel about 0.008 inch (0.02 cm) thick onto the gold layer. The nickel stamping master was separated from the recording master at the interface between the gold layer and electron beam resist layer. Excellent negative grooves were obtained on the stamping master, faithful to the information recorded in the electron beam resist.

Various other metal coatings were evaporated under vacuum onto glass slides to measure adhesion of an olefin-$SO_2$ electron beam resist film as above during a nickel electroplating step, including aluminum, nickel, copper, chromium, silver, platinum, palladium, titanium and silicon. Only gold coated substrates gave acceptable results.

We claim:

1. In the method of fabricating a video disc record whereby a grooved copper recording master is coated with an olefin-$SO_2$ copolymer electron beam resist, the electron beam resist is exposed to a video signal-modulated beam of electrons produced by a scanning electron microscope, developed with a developer solvent to form a geometric surface relief pattern in the bottom of the groove, and electroplated with nickel to form a stamping master negative of said recording master, the improvement which comprises applying a layer of gold onto the grooved copper recording master prior to applying the olefin-$SO_2$ copolymer resist.

2. A method according to claim 1 wherein the gold layer is from about 1000 to 2000 angstroms thick.

3. A method according to claim 1 wherein the gold layer is applied by evaporation.

4. A method according to claim 1 wherein prior to said gold layer a first layer of chromium about 200 to 500 angstroms thick is evaporated onto the grooved recording master.

5. A method according to claim 1 wherein a layer of gold about 1000 to 5000 angstroms thick is applied to the developed resist layer prior to electroplating.

6. A method according to claim 1 wherein the electron beam resist is 1-methylcyclopentene-$SO_2$ copolymer.

7. A method according to claim 2 wherein prior to said gold layer a first layer of chromium about 200 to 500 angstroms thick is evaporated onto the grooved recording master and wherein the electron beam resist is 1-methylcyclopentene-$SO_2$ copolymer.

* * * * *